(12) United States Patent
Ordentlich et al.

(10) Patent No.: US 8,405,530 B2
(45) Date of Patent: Mar. 26, 2013

(54) ENCODING DATA BASED ON WEIGHT CONSTRAINTS

(75) Inventors: Erik Ordentlich, San Jose, CA (US);
Ron M. Roth, Haifa (IL)

(73) Assignee: Hewlett-Packard Development Company, L.P., Houston, TX (US)

( * ) Notice: Subject to any disclaimer, the term of this patent is extended or adjusted under 35 U.S.C. 154(b) by 119 days.

(21) Appl. No.: 13/211,695

(22) Filed: Aug. 17, 2011

(65) Prior Publication Data
US 2013/0044011 A1 Feb. 21, 2013

(51) Int. Cl.
*H03M 5/00* (2006.01)
(52) U.S. Cl. ............... 341/58; 341/51; 341/59; 341/155; 341/144
(58) Field of Classification Search .................... 341/50, 341/51, 153, 58, 144, 161, 158
See application file for complete search history.

(56) References Cited

U.S. PATENT DOCUMENTS

| | | | | |
|---|---|---|---|---|
| 5,973,631 | A * | 10/1999 | McMullen et al. | 341/144 |
| 6,559,785 | B2 * | 5/2003 | Kuttner | 341/155 |
| 6,914,550 | B2 * | 7/2005 | Cai | 341/155 |
| 7,369,077 | B2 * | 5/2008 | Carroll | 341/153 |
| 2005/0012650 | A1 * | 1/2005 | Cretti et al. | 341/144 |
| 2006/0232461 | A1 * | 10/2006 | Felder | 341/161 |
| 2008/0180579 | A1 * | 7/2008 | Maxim | 348/735 |

\* cited by examiner

*Primary Examiner* — Jean B Jeanglaude

(57) ABSTRACT

A method for encoding data to be placed into a weight constrained memory array includes designating a set of crosspoints within a crossbar memory array as indicator crosspoints and a set of crosspoints within the memory array as data crosspoints, the set of indicator crosspoints selected so that a net number of times that each data crosspoint has been flipped can be determined from a subset of the set of indicator crosspoints, placing an input stream of data into a matrix corresponding to crosspoints within the memory array, bits of the input stream being placed into matrix elements that correspond to data crosspoints of the memory array, setting each matrix element corresponding to indicator crosspoints to a value corresponding to a fixed resistive state, and flipping each bit corresponding to a conductor of the memory array until no conductors within the memory array violate a weight constraint.

15 Claims, 7 Drawing Sheets

Structure Matrix (310)

Data Crosspoints (402)

| | A | B | C | D | E | F | G | H | I |
|---|---|---|---|---|---|---|---|---|---|
| 1 | 1 | 1 | 1 | 0 | 0 | 0 | 0 | 0 | 0 |
| 2 | 0 | 0 | 0 | 1 | 1 | 1 | 0 | 0 | 0 |
| 3 | 0 | 0 | 0 | 0 | 0 | 0 | 1 | 1 | 1 |
| 4 | 1 | 0 | 0 | 1 | 0 | 0 | 1 | 0 | 0 |
| 5 | 0 | 1 | 0 | 0 | 1 | 0 | 0 | 1 | 0 |
| 6 | 0 | 0 | 1 | 0 | 0 | 1 | 0 | 0 | 1 |

Indicator Crosspoint (404)

ENCODING DATA BASED ON WEIGHT CONSTRAINTS

BACKGROUND

Electronic data is typically represented using a binary number system. The binary number system is one in which values may take on one of two states, typically represented by a "1" and a "0". Various types of memory systems have been developed which include small programmable devices that store a single bit as either a "1" or a "0". For example, a transistor may be used as a switch which is either in an ON state or an OFF state. The ON state may be used to represent a "1" while the OFF state may be used to represent a "0".

One type of memory architecture is the crossbar memory architecture. The crossbar architecture includes two sets of interconnecting conductive wire segments. A memory element is placed at each crosspoint between each wire segment. In one example, crossbar architecture may employ memristors as memory elements. A memristor is a device which is able to change the value of its resistance in response to various programming conditions. A memristor may represent a "1" while in a low resistance state and a "0" while in a high resistance state.

When resistance based memory elements such as memristors are placed in an array with crossbar architecture, it may be desirable to limit the number of memory elements in a low resistive state along a particular wire segment of the crossbar architecture. Having too many memory elements in a low resistive state along a particular wire segment may allow too much electric current to pass through. Too much electric current passing through the wire segments may potentially interfere with read/write operations and can also damage the wire segments and other components of the read/write circuitry.

BRIEF DESCRIPTION OF THE DRAWINGS

The accompanying drawings illustrate various examples of the principles described herein and are a part of the specification. The drawings are merely examples and do not limit the scope of the claims.

Throughout the drawings, identical reference numbers designate similar, but not necessarily identical, elements.

DETAILED DESCRIPTION

Figure 1:
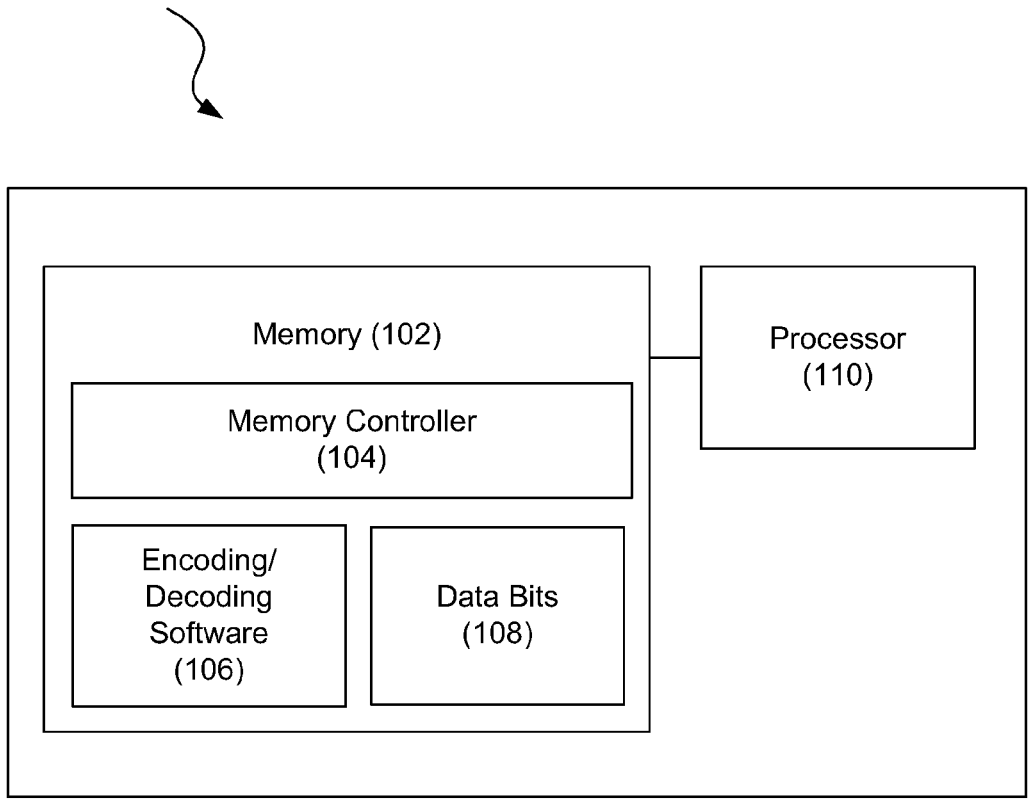
FIG. 1 is a diagram showing an illustrative physical computing system, according to one example of principles described herein.

As mentioned above, when resistance based memory elements such as memristors are placed in an array with crossbar architecture, it may be desirable to limit the number of memory elements in a low resistive state along a particular wire segment, which will be referred to hereinafter as a conductor, of the crossbar architecture. Having too many memory elements in a low resistive state along a particular conductor may allow too much electric current to pass through. Too much electric current passing through the conductors may potentially interfere with read/write operations and can also damage the conductors and other components of the read/write circuitry.

In light of this and other issues, the present specification discloses methods and systems for encoding data to be placed into a crossbar memory array so that each conductor within the memory array does not violate a weight constraint that restricts how many crosspoints along a particular conductor may be in a low resistive state. For example, if a low resistive state represents a logical '1', then the number of memory elements along the crosspoints of the memory array that store a '1' may be limited to less than half of the total number of crosspoints along a particular conductor.

According to certain illustrative examples, a set of crosspoints within the entire memory array are reserved as indicator crosspoints. The remaining crosspoints are used to store data and will be referred to as data crosspoints. A matrix is then formed such that each crosspoint of the memory array corresponds to an element of that matrix. The elements of that matrix that correspond to indicator crosspoints are initialized to a bit value that represents a fixed resistive state. This fixed resistive state may be relatively high, and thus little current will flow through the memory element at that crosspoint when in that state. For illustrative purposes, throughout this specification, a high resistive state will be represented by a bit value of '0' and a low resistive state will be represented by a bit value of '1'. Thus, the elements within the matrix that correspond to indicator crosspoints are initialized to '0'. This matrix may be stored in any type of computer memory such as a cache of a memory controller for the crossbar memory array.

An input stream of data is then placed into the matrix elements that correspond to the data crosspoints of the crossbar memory array. At this point, if the data in the corresponding matrix were to be written to the crossbar memory array, there would be several weight constraint violations. For example, there may be many conductors for which more than half of the crosspoints are storing a '1'. To avoid this situation, the data is encoded by examining the matrix elements that correspond to a particular conductor and flipping all of the bits corresponding to that conductor if that conductor is in violation of the weight constraint. Flipping a bit refers to changing a '1' to a '0' or a '0' to a '1'. This flipping process continues for different conductors until there are no more weight constraint violations within the memory array. When flipping the bits corresponding to each crosspoint of a particular conductor, the bits within matrix elements corresponding to both the data crosspoints and the indicator crosspoints will be flipped.

The exact crosspoints within a crossbar array that are designated as indicator crosspoints are selected so that for each data crosspoint within the memory array, it can be determined whether the bit corresponding to that data crosspoint has been flipped an odd or even number of times by examining the state of a subset of the indicator crosspoints. This information is used during the decoding process. If a bit has been flipped an even number of times, then it will not have to be flipped during the decoding process. However, if a bit has been flipped an odd number of times during the encoding process, then that bit will be flipped during the decoding process.

Through use of methods and systems embodying principles described herein, data to be placed in any type or structure of crossbar array may be encoded so that weight constraints are not violated. This general method of encoding will work despite the topology of the crossbar array. For example, this method will work on even crossbar arrays where each conductor is aligned with an adjacent parallel conductor. It will also work with disjointed crossbar arrays where each conductor may be offset from an adjacent parallel conductor.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with that example is included as described, but may not be included in other examples.

Referring now to the figures, FIG. 1 is a diagram showing an illustrative physical computing system (100). According to certain illustrative embodiments, a physical computing system (100) may be used to encode the bits which are to be stored in a crossbar memory structure. A physical computing system (100) may include a processor (110) and a memory (102) having a memory controller (104). The memory (102) has encoding and decoding software (106) and data bits (108) stored thereon.

The physical computing system (100) may be embodied as several different types of computing devices including, but not limited to, a server, a laptop computer, a desktop computer, or a Personal Digital Assistant (PDA), or a general processing device. In some embodiments, the physical computing system may be a piece of hardware designed specifically for encoding or decoding bits. The physical computing system (100) may include a form of memory (102) including, but not limited to, a magnetic disk drive, a solid state drive, and/or an optical disc drive.

A memory controller (104) is a digital circuit which manages the flow of data to and from the memory (102). In some cases, a memory controller (104) is integrated with the memory (102) while in some cases the memory controller is separate from the memory (102). The encoding software (106) stored by the memory (102) may be embodied as a computer readable code configured to cause a processor (110) to execute various instructions related to encoding data bits (108) to be stored on a crossbar memory structure.

Figure 2:
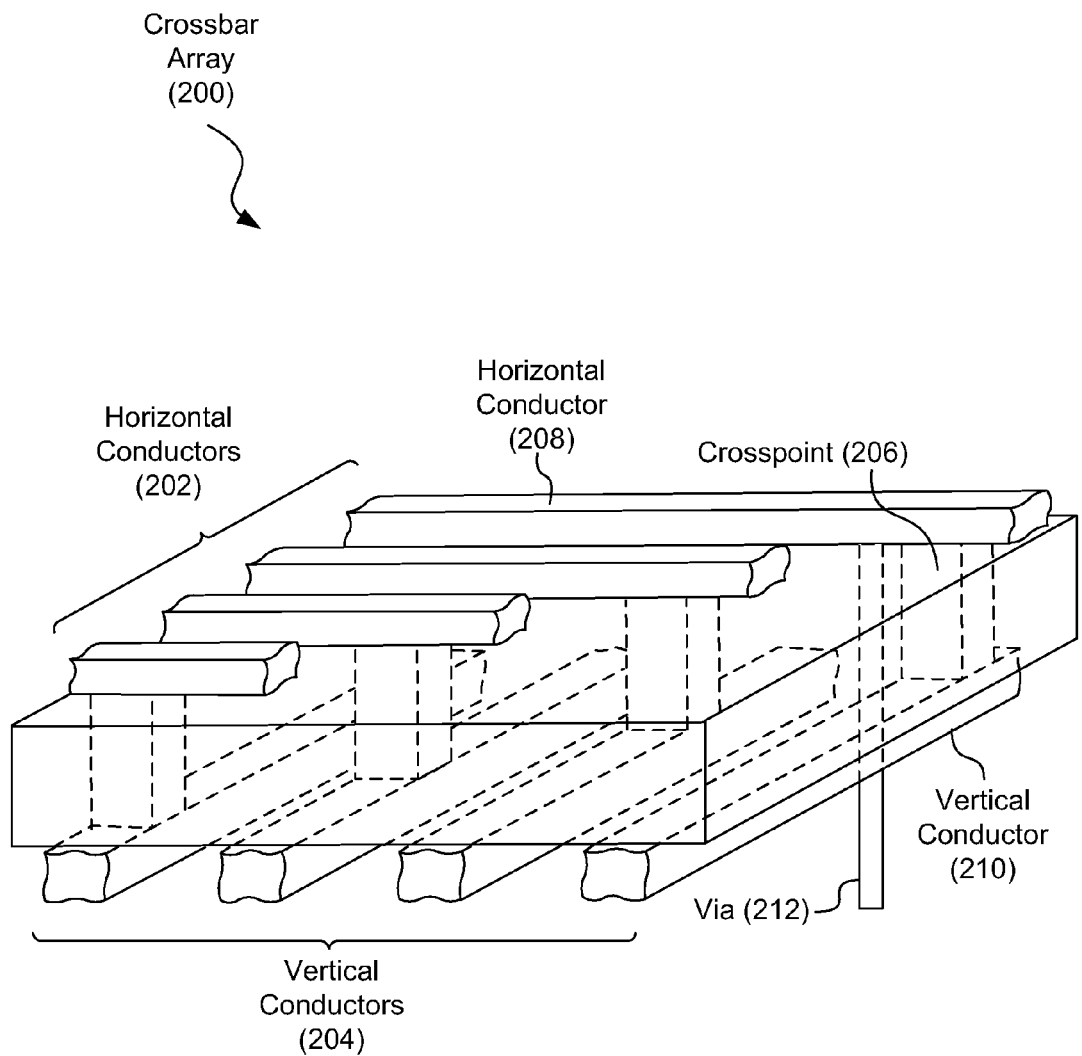
FIG. 2 is a diagram showing an illustrative crossbar memory array, according to one example of principles described herein.

FIG. 2 is a diagram showing an illustrative crossbar memory array (200). According to certain illustrative examples, the crossbar array (200) includes a set of horizontal conductors (202) which are generally in parallel. Additionally, a set of vertical conductors (204) is generally perpendicular to, and intersects, the horizontal conductors (202). Programmable memory elements are placed at the crosspoints (206) between a horizontal conductor (208) and a vertical conductor (210).

According to certain illustrative examples, the programmable memory elements may be memristive devices. Memristive devices exhibit a "memory" of past electrical conditions. For example, a memristive device may include a matrix material which contains mobile dopants. These dopants can be moved within a matrix to dynamically alter the electrical operation of the memristive device.

The motion of dopants can be induced by the application of a programming condition such as an applied electrical voltage across a suitable matrix. The programming voltage generates a relatively high electrical field through the memristive matrix and alters the distribution of dopants. After removal of the electrical field, the location and characteristics of the dopants remain stable until the application of another programming electrical field. For example, by changing the dopant configurations within a memristive matrix, the electrical resistance of the device may be altered. The memristive device is read by applying a lower reading voltage which allows the internal electrical resistance of the memristive device to be sensed but does not generate a high enough electrical field to cause significant dopant motion. Consequently, the state of the memristive device may remain stable over long time periods and through multiple read cycles.

According to certain illustrative examples, the crossbar array (200) may be used to form a non-volatile memory array. Each of the programmable memory elements at the crosspoints (206) is used to represent one or more bits of data. Although individual conductors (208, 210) in FIG. 2 are shown with rectangular cross sections, crossbars may also have square, circular, elliptical, or more complex cross sections. The lines may also have many different widths, diameters, aspect ratios and/or eccentricities. The crossbars may be nanowires, sub-microscale wires, microscale wires, or wires with larger dimensions.

According to certain illustrative examples, the crossbar architecture (200) may be integrated into a Complimentary Metal-Oxide-Semiconductor (CMOS) circuit or other conventional computer circuitry. Each individual wire segment may be connected to the CMOS circuitry by a via (212). The via (212) may be embodied as an electrically conductive path through the various substrate materials used in manufacturing the crossbar architecture. This CMOS circuitry can provide additional functionality to the memristive device such as input/output functions, buffering, logic, configuration, or other functionality. Multiple crossbar arrays can be formed over the CMOS circuitry to create a multilayer circuit.

Figure 3A:
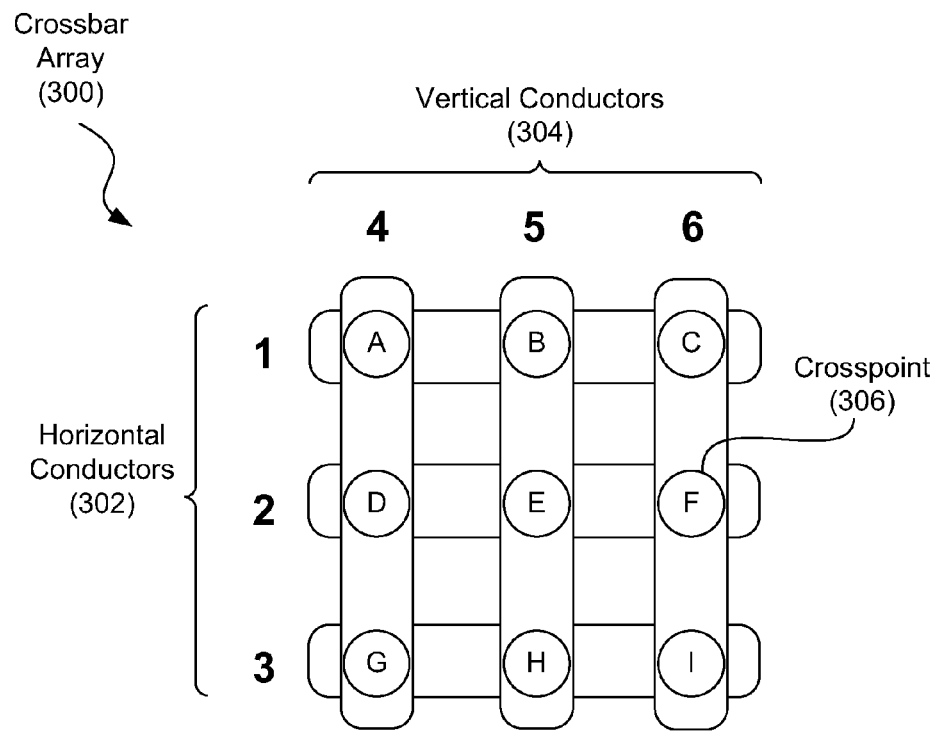
FIG. 3A is a diagram showing an illustrative crossbar array structure, according to one example of principles described herein.

FIG. 3A is a diagram showing an illustrative crossbar array structure. The crossbar array (300) of FIG. 3A is a simplified crossbar array that is used to illustrate the process of selecting indicator crosspoints and data crosspoints within a crossbar memory array. According to certain illustrative examples, the crossbar array (300) includes a set of horizontal conductors (302) which are labeled 1, 2, and 3. The crossbar array (300) also includes a set of vertical conductors (304) which are labeled 4, 5, and 6. Each crosspoint (306) between the horizontal conductors (302) and the vertical conductors (304) is identified with a letter of the alphabet.

Figure 3B:
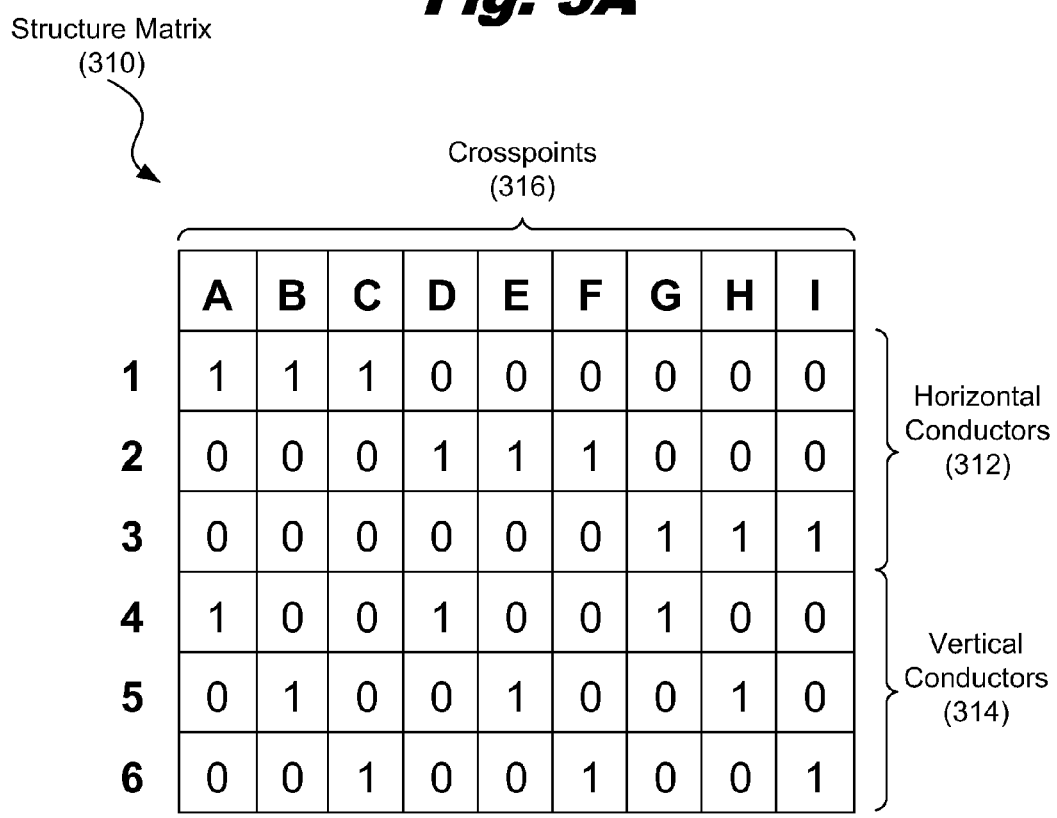
FIG. 3B is a diagram showing an illustrative structure matrix associated with the crossbar structure of FIG. 3A, according to one example of principles described herein.

FIG. 3B is a diagram showing an illustrative structure matrix (310) associated with the crossbar structure of FIG. 3A. According to certain illustrative examples, the structure of the crossbar array (300) can be represented in a binary matrix which will be referred to as a structure matrix. A binary matrix is one in which each element has a value of either '1' or '0'. The row of each structure matrix represents each conductor within the crossbar array (300). Thus, rows 1, 2, and 3 correspond to the horizontal conductors (312) and rows 4, 5, and 6 correspond to the vertical conductors (314). The columns within the structure matrix (310) represent each crosspoint (316) within the entire crossbar array (300). For each column within the structure matrix, there will be a '1' in the rows corresponding to the conductors which cross to form that crosspoint. Thus, each column will have a total of two 1's. The remaining rows within each column are set to zero.

Figures 4A, 4B:
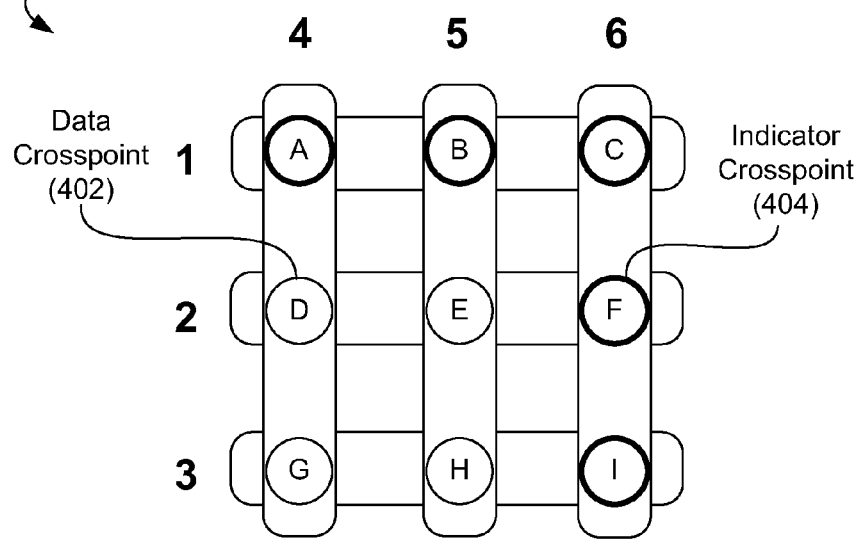
FIG. 4A is a diagram showing the assignment of indicator crosspoints and data crosspoints on the structure matrix, according to one example of principles described herein.
FIG. 4B is a diagram showing an illustrative assignment of indicator crosspoints and data crosspoints within a crossbar memory array, according to one example of principles described herein.

FIG. 4A is a diagram showing the assignment of indicator crosspoints (404) and data crosspoints (402) on the structure matrix (310). As mentioned above, the exact crosspoints within a crossbar array that are designated as indicator bits are selected so that for each data crosspoint within the memory array, it can be determined whether the bit corresponding to that data crosspoint has been flipped an odd or even number of times by examining the state of a subset of the indicator crosspoints.

According to certain examples, this may be done by finding a set of basis columns for the structure matrix (310). A set of basis columns is a set in which any column within the matrix that is not one of the basis columns can be created by a combination of a subset of the basis columns. Throughout this specification a "combination" of one or more columns in a binary matrix refers to the exclusive OR operation of each corresponding element within those one or more columns. This is also the same as applying a modulo 2 operation to the sum of each corresponding element of the columns being combined.

In general, there is not a unique set of basis columns which may be used. The process of determining which set of basis columns to use may be done so that the smallest set of basis columns is chosen. Various principles within the field of linear algebra can be used to easily determine the smallest possible set of basis columns. Such functions are beyond the scope of the present specification and will not be described here.

Upon determining the smallest set of basis columns, the crosspoints corresponding to the basis columns will be designated as indicator crosspoints (404). The crosspoints not corresponding to basis columns will be designated as data crosspoints (402). In this example, crosspoints, A, B, C, F, and I have been designated as indicator crosspoints (404) and crosspoints D, E, G, and H have been designated as data crosspoints. Because the crossbar array used in this example is small for illustrative purposes, there are more indicator crosspoints (404) than data crosspoints (402). However, a practical crossbar array may comprise a much larger number of conductors and crosspoints and therefore the ratio of indicator crosspoints to data crosspoints would be much smaller.

FIG. 4B is a diagram showing an illustrative assignment of indicator crosspoints and data crosspoints within the crossbar memory array (300). The indicator crosspoints (404) are shown with bolded circles around the identifying letter and the data crosspoints (402) are shown as non-bolded circles around the identifying letter. Thus, the example crossbar array (300) is capable of storing four bits of data.

Figure 5A:
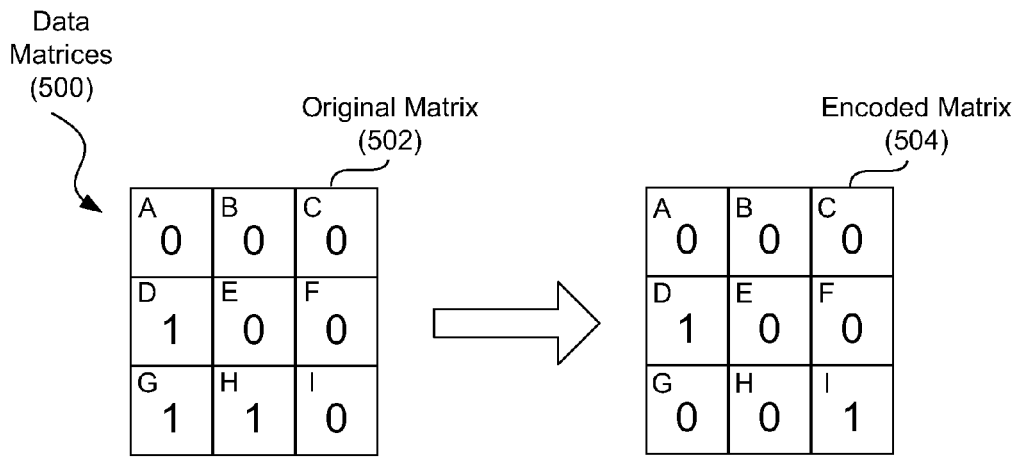
FIG. 5A is a diagram showing an illustrative placement of data within a crossbar array, according to one example of principles described herein.

FIG. 5A is a diagram showing an illustrative placement of data within a crossbar array. According to certain illustrative examples, to encode data for placement into the crossbar array, an input stream of data is placed into a data matrix (500). The data matrix is such that each element within the data matrix corresponds to a crosspoint of the memory array to which the data will be stored. The elements of the data matrix that correspond to the indicator bits are initialized to '0'. The input data stream can then be read into the matrix elements corresponding to the data crosspoints.

FIG. 5A illustrates a data matrix (502) in its original state. In the original state, the data read into the matrix elements corresponding to data crosspoints has not yet been encoded. The center of each matrix element illustrates the bit value of that element. The top left corner of each matrix element illustrates the corresponding crosspoint for that matrix element.

With the data placed into the data matrix (500), the encoding process begins by examining each set of matrix elements that correspond to a conductor and determining if there is a weight constraint violation. In this case, the matrix elements that correspond to conductor 3 violate a weight constraint. Specifically, if the data was read into the crossbar memory array as is, more than half the crosspoints along conductor 3 would be in a low resistive state and thus violate the weight constraint. Thus, each bit within matrix elements corresponding to conductor 3 is flipped.

FIG. 5A also illustrates the data matrix (504) in its encoded state. In this example, there was only one conductor which violated the weight constraint and thus only one iteration of flipping occurred. As is illustrated, the matrix elements that correspond to both data crosspoints and indicator crosspoints are flipped. The final encoded matrix (504) includes no weight constraint violations.

In some cases, multiple conductors will have to be flipped in order to eliminate all weight constraint violations. It may be the case that a particular conductor which originally did not violate a weight constraint will eventually violate the weight constraint due to the flipping of bits along conductors that intersect that particular conductor. The process of going through each set of elements corresponding to a conductor within the array and determining whether there is a weight constraint violation may have to be repeated several times. This may cause a particular bit within the data matrix to be flipped multiple times. Each time that the bits within a set of elements within the data matrix that correspond to a particular conductor are flipped due to a weight constraint violation, the total number of 1's stored within the data matrix is reduced. Thus, there will eventually be a point when there are no weight constraint violations.

With the data within the encoded matrix (504) no longer violating any weight constraints, the data from the encoded matrix can be read into the crossbar array. The data for each matrix element will be placed into its corresponding crosspoint within the array. Both data crosspoints and indicator crosspoints will be stored according to the data in the data matrix. In order to read data within the crossbar array, the data is first decoded.

Figure 5B:
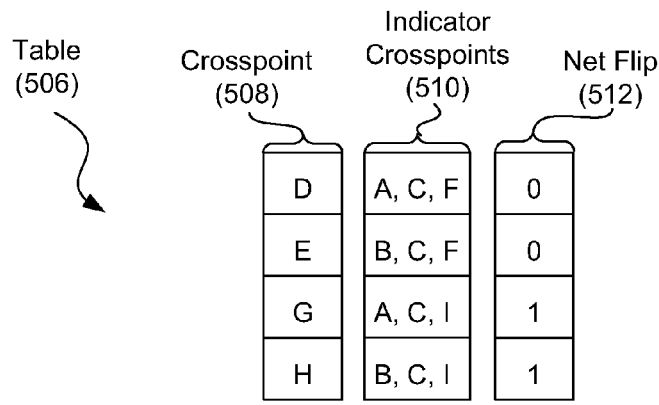
FIG. 5B is a diagram showing an illustrative decoding table, according to one example of principles described herein.

FIG. 5B is a diagram showing an illustrative decoding table (506). In order to decode the data stored within the crossbar array, it is determined the net number of times each data bit was flipped during the encoding process. Throughout this specification and in the appended claims, the phrase "net number of times a bit has been flipped" refers to whether that bit has been flipped an even or odd number of times. This can be determined by taking the total number of flips modulo 2. If a particular bit was flipped an even number of times, then that bit does not have to be flipped to be decoded. If a particular bit was flipped an odd number of times, then that bit does have to be flipped to be decoded. Thus, the total number of times a bit has been flipped is not relevant. Rather, it is only relevant whether the bit was flipped an even or an odd number of times during the encoding process.

According to certain illustrative examples, it can be determined whether a particular bit was flipped an even or an odd number of times by examining the state of the indicator bits that are associated with that particular data bit. The set of indicator bits that are associated with a particular data bit correspond to the subset of basis columns of the structure matrix that, in combination, form the column of the structure matrix corresponding to that particular data bit. Each data bit within the crossbar memory array will have at least one such subset of indicator bits associated with that data bit.

Each row within the table corresponds to a particular data crosspoint. The crosspoint column (508) uniquely identifies a crosspoint for each row. The indicator crosspoints column (510) indicates the set of indicator crosspoints that are used to determine the odd or even flip status of the corresponding data crosspoint. The net flip column (512) indicates the net number of times that the corresponding data crosspoint was flipped during the encoding process.

As is indicated by the table (506), data crosspoint D is associated with indicator crosspoints A, C, and F. Referring back to FIG. 4A, column D can be created by a combination of basis columns A, C, and F. The structure matrix column corresponding to each data crosspoint within the decoding table (506) can be created by a combination of the subset of basis columns indicated. In order to determine the net number of times a bit has been flipped, the exclusive OR (XOR) operation is applied to each bit stored in the subset of indicator crosspoints used to denote a particular data crosspoint. This is the same as applying a modulo 2 function to the sum of each of those bits.

The XOR of the bits stored in crosspoints A, C, and F of the encoded crossbar array is '0'. Likewise, the XOR of the bits stored in crosspoints B, C, and F is '0'. Thus, the bits from crosspoints D and E do not have to be flipped during the decoding process. However, the XOR of the bits stored in crosspoints A, C, and I is '1'. Likewise, the XOR of the bits stored in crosspoints B, C, and I is '1'. Thus, the bits stored within crosspoints G and H have been flipped an odd number of times and should therefore be flipped during the decoding process.

Figure 5C:
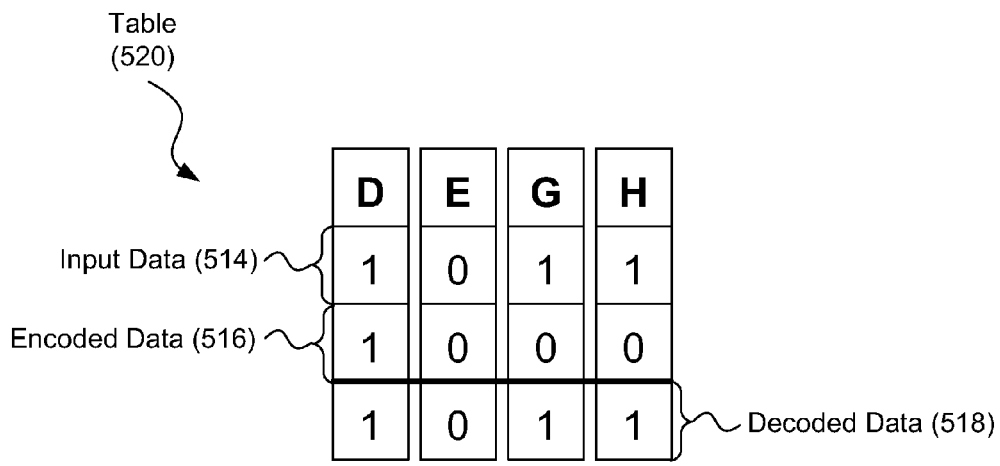
FIG. 5C is a diagram showing an illustrative table comparing data at different stages in an encoding/decoding process, according to one example of principles described herein.

FIG. 5C is a diagram showing an illustrative table comparing data at different stages in an encoding/decoding process. The columns within the table correspond to the data crosspoints within the crossbar array. The first row indicates the input data (514) before it is encoded. The second row indicates the encoded data (516) as it is written into the crossbar array. The last row indicates the data after it has been decoded through use of the information in the net flip column (512) of FIG. 5B. As should be the case, the decoded data (518) matches the input data (514).

In some cases, the decoding logic can know which crosspoints have been designated as indicator crosspoints based on the encoding process. For example, when designating crosspoints as indicator crosspoints, the encoding logic can store that information. That information can then be available to the decoding logic. The bits which are designated as indicator crosspoints can remain as indicator bits each time the data within the crossbar array is rewritten. Thus, the designation process may only occur once and the coding process uses the same crosspoints as indicator crosspoints every time that data is encoded for storage into the crossbar array.

In some cases, the bits designated as indicator crosspoints are part of the design and thus the encoding logic will not have to indicate to the decoding logic which bits have been designated as indicator crosspoints. Rather, the specific crosspoints which are designated as indicator crosspoints can be hard-coded into the decoding logic.

Figure 6:
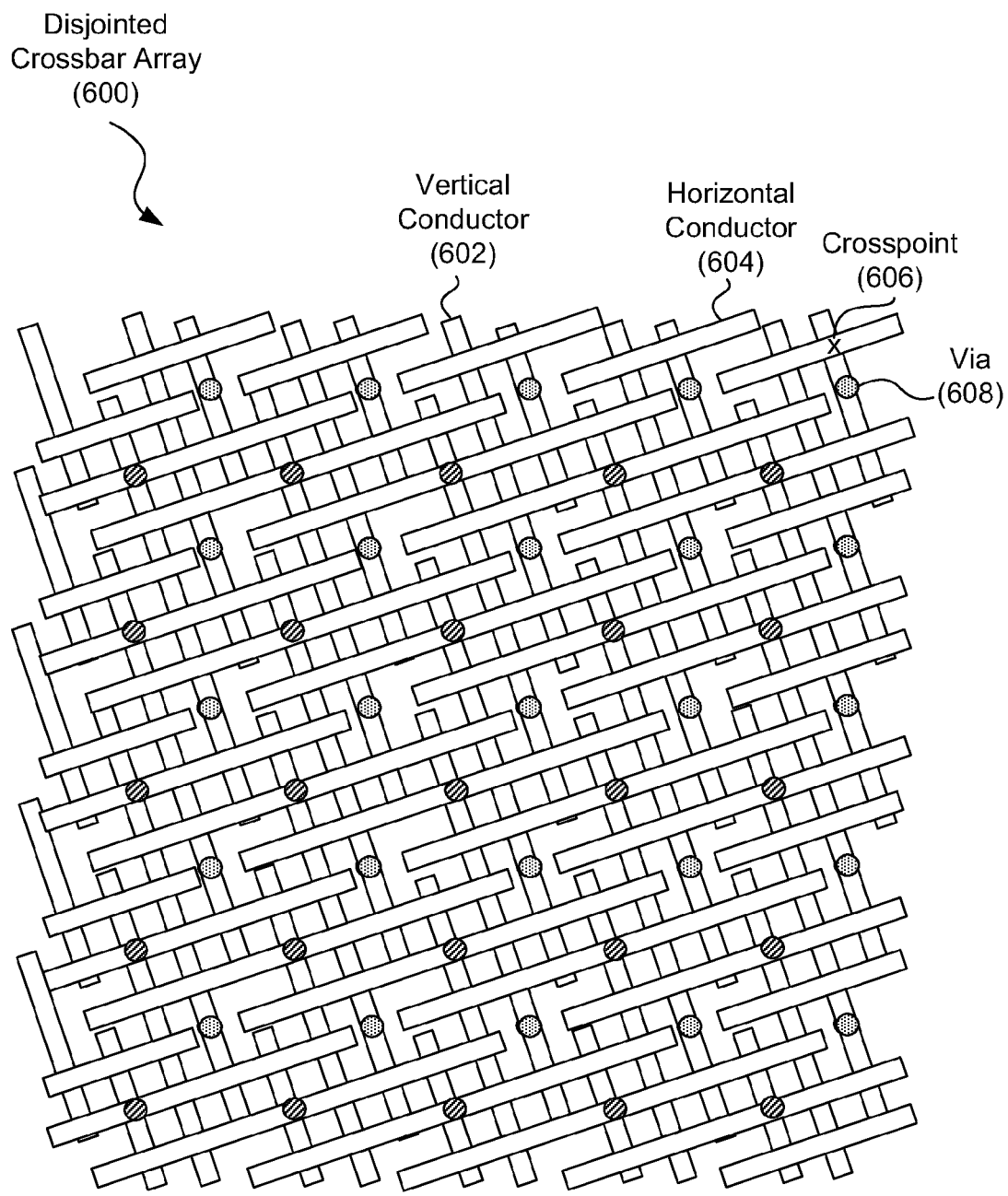
FIG. 6 is a diagram showing an illustrative disjointed crossbar array structure, according to one example of principles described herein.

FIG. 6 is a diagram showing an illustrative disjointed crossbar array structure. The methods of encoding data for placement into a crossbar array with weight constraints as described herein are not limited to a specific crossbar array structure. Rather, these methods can be used to encode data for a variety of different structures. One type of crossbar structure which may be used is a disjointed crossbar array structure.

According to certain illustrative examples, a disjointed crossbar array (600) includes a set of vertical conductors (602) and a set of horizontal conductors (604). The terms horizontal and vertical do not indicate a specific orientation. Rather, the terms indicate an orientation relative to each other. Memory elements may be placed at crosspoints (606) between each of the conductors. Not every pair of horizontal and vertical conductors share a crosspoint. For example, the vertical conductor (602) and the horizontal conductor (604) do not intersect and do not share a crosspoint. The conductors may be connected to read/write circuitry through a via (608). In this case, the vias are positioned in the center of each of the conductors (602, 604).

Each conductor within the disjointed crossbar array is not aligned with the adjacent conductor running parallel to that conductor. Rather, each parallel conductor is offset by one or more crosspoint distances from an adjacent parallel conductor. Furthermore, not every conductor within the disjointed crossbar array (600) necessarily includes the same number of crosspoints.

The methods illustrated and described above for encoding data to be placed on a simple three-by-three crossbar array can be applied to a more complicated crossbar array such as the disjointed crossbar shown in FIG. 6. Specifically, a structure matrix can be formed wherein each row corresponds to a conductor within the disjointed crossbar array (600) and each column corresponds to each crosspoint within disjointed crossbar array (600). A set of basis columns can then be determined in order to designate a set of crosspoints as indicator crosspoints. With the indicator bits designated, the encoding process can proceed as described above.

Figure 7:
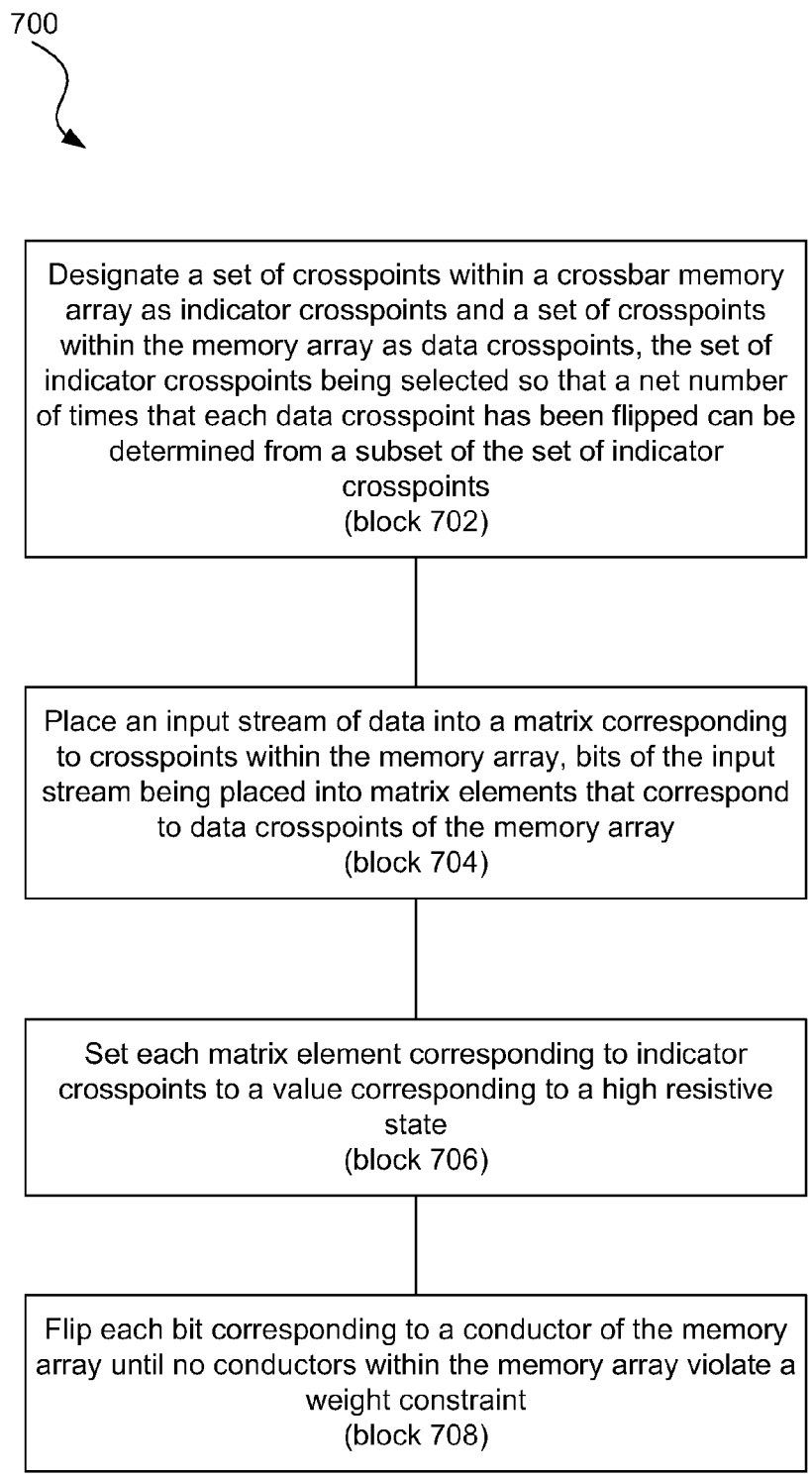
FIG. 7 is a flowchart showing an illustrative method for encoding data for placement into a weight constrained crossbar array, according to one example of principles described herein.

FIG. 7 is a flowchart showing an illustrative method for encoding data for placement into a weight constrained crossbar array. According to certain illustrative examples, the method includes designating (block 702) a set of crosspoints within a crossbar memory array as indicator crosspoints and a set of crosspoints within the memory array as data crosspoints, the set of indicator crosspoints selected so that a net number of that each data crosspoint has been flipped can be identified from a subset of the set of indicator crosspoints. The method further includes placing (block 704) an input stream of data into a matrix corresponding to crosspoints within the memory array, bits of the input stream being placed into matrix elements that correspond to data crosspoints of the memory array, setting (block 706) each matrix element corresponding to indicator crosspoints to a value corresponding to a high resistive state, and flipping (block 708) each bit corresponding to a conductor of the memory array until no conductors within the memory array violate a weight constraint.

In conclusion, through use of methods and systems embodying principles described herein, data to be placed in any type or structure of crossbar array may be encoded so that weight constraints are not violated. This general method of encoding will work despite the topology of the crossbar array. For example, this method will work on even crossbar arrays where each conductor is aligned with an adjacent parallel conductor. It will also work with disjointed crossbar arrays where each conductor may be offset from an adjacent parallel conductor.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A method for encoding data to be placed into a weight constrained memory array performed by a physical computing system, the method comprising:
    designating a set of crosspoints within a crossbar memory array as indicator crosspoints and a set of crosspoints within said memory array as data crosspoints, said set of indicator crosspoints selected so that a net number of times that each data crosspoint has been flipped can be determined from a subset of said set of indicator crosspoints;
    placing an input stream of data into a matrix corresponding to crosspoints within said memory array, bits of said input stream being placed into matrix elements that correspond to data crosspoints of said memory array;
    setting each matrix element corresponding to indicator crosspoints to a value corresponding to a fixed resistive state; and
    flipping each bit corresponding to a conductor of said memory array until no conductors within said memory array violate a weight constraint.

2. The method of claim 1, further comprising, writing said bits of said matrix into their corresponding crosspoints of said crossbar memory array.

3. The method of claim 2, further comprising decoding said array by:
    copying data stored within said array into a decoding matrix, each element of said decoding matrix corresponding to a crosspoint within said memory array;
    for each element within said decoding matrix corresponding to a data crosspoint, flipping that bit if a state of said subset of said set of indicator crosspoints indicates that that bit has been flipped an odd number of times; and
    forming an output stream of data from the decoding matrix elements corresponding to the data crosspoints within said memory array.

4. The method of claim 1, wherein said set of indicator crosspoints is determined by:
    forming a binary structure matrix wherein each row corresponds to each conductor within said crossbar memory array and each column corresponds to each crosspoint within said crossbar memory array;
    for each row of said structure matrix, storing a '1' in each column that corresponds to a crosspoint that is along a conductor corresponding to that row and otherwise storing a '0'; and
    determining a set of basis columns for said structure matrix, crosspoints associated with said basis columns being assigned as indicator crosspoints.

5. The method of claim 1, wherein a programmable memory element at each of said crosspoints is a resistive memory element.

6. The method of claim 1, wherein said crossbar array is a disjointed crossbar memory array.

7. The method of claim 1, wherein said weight constraint comprises a rule that no more than half of the crosspoints along a single conductor should be in a low resistive state.

8. A computing system comprising:
    at least one processor;
    a crossbar memory array; and
    a memory communicatively coupled to the at least one processor, the memory comprising computer executable code that, when executed by the at least one processor, causes the at least one processor to:
        designate a set of crosspoints within said crossbar memory array as indicator crosspoints and a set of crosspoints within said memory array as data crosspoints, said set of indicator crosspoints selected so that a net number of times that each data crosspoint has been flipped can be determined from a subset of said set of indicator crosspoints;
        place an input stream of data into a matrix corresponding to crosspoints within said memory array, bits of said input stream being placed into matrix elements that correspond to data crosspoints of said memory array;
        set each matrix element corresponding to indicator crosspoints to a value corresponding to a fixed resistive state; and
        flip each bit corresponding to a conductor of said memory array until no conductors within said memory array violate a weight constraint.

9. The system of claim 8, wherein said at least one processor is further configured to write said bits of said matrix into their corresponding crosspoints of said crossbar memory array.

10. The system of claim 9, wherein to decode said memory array, said at least one processor is further configured to:
    copy data stored within said array into a decoding matrix, each element of said decoding matrix corresponding to a crosspoint within said memory array;
    for each element within said decoding matrix corresponding to a data crosspoint, flip that bit if a state of said subset of said set of indicator crosspoints indicates that that bit has been flipped an odd number of times; and
    form an output stream of data from the decoding matrix elements corresponding to the data crosspoints within said memory array.

11. The system of claim 8, wherein, to determine said set of indicator crosspoints, said at least one processor is further configured to:
    form a binary structure matrix wherein each row corresponds to each conductor within said crossbar memory array and each column corresponds to each crosspoint within said crossbar memory array;
    for each row of said structure matrix, storing a '1' in each column that corresponds to a crosspoint that is along a conductor corresponding to that row and otherwise storing a '0'; and
    determine a set of basis columns for said structure matrix, crosspoints associated with said basis columns being assigned as indicator crosspoints.

12. The system of claim 8, wherein a programmable memory element at each of said crosspoints is a resistive memory element.

13. The system of claim 8, wherein said crossbar array is a disjointed crossbar memory array.

14. The system of claim 8, wherein said weight constraint comprises a rule that no more than half of the crosspoints along a single conductor should be in a low resistive state.

15. A method for encoding data to be placed into a weight constrained memory array performed by a physical computing system, the method comprising:

placing an input stream of data into a matrix corresponding to crosspoints within a crossbar memory array, bits of said input stream being placed into matrix elements that have been designated as data crosspoints;

setting each matrix element that corresponds to a set of crosspoints within said memory array that have been designated as indicator crosspoints to a value corresponding to a fixed resistive state, said set of indicator crosspoints being designated so that a net number of times a bit stored in each of said data crosspoints can be identified by a state of a subset of said set of indicator crosspoints; and examining each conductor of said memory array and flipping each bit corresponding to a crosspoint of that conductor if more than half of the crosspoints on that conductor are in a low resistive state.

* * * * *

UNITED STATES PATENT AND TRADEMARK OFFICE
CERTIFICATE OF CORRECTION

PATENT NO. : 8,405,530 B2
APPLICATION NO. : 13/211695
DATED : March 26, 2013
INVENTOR(S) : Erik Ordentlich et al.

It is certified that error appears in the above-identified patent and that said Letters Patent is hereby corrected as shown below:

In the Claims

In column 9, line 43, in Claim 3, delete "that bit" and insert -- bit --, therefor.

In column 10, line 39, in Claim 10, delete "that bit" and insert -- bit --, therefor.

Signed and Sealed this
Seventeenth Day of September, 2013

Teresa Stanek Rea
*Deputy Director of the United States Patent and Trademark Office*